United States Patent [19]

Wignot et al.

[11] Patent Number: 5,361,406
[45] Date of Patent: * Nov. 1, 1994

[54] AUDIO LEVEL EQUALIZATION OF BROADCAST AND NATIONAL WEATHER SERVICE FM RADIO SIGNALS

[75] Inventors: Leroy S. Wignot; Dal F. Griepentrog, both of Indianapolis, Ind.

[73] Assignee: Thomson Consumer Electronics, Inc., Indianapolis, Ind.

[*] Notice: The portion of the term of this patent subsequent to Sep. 1, 2009 has been disclaimed.

[21] Appl. No.: 110,476

[22] Filed: Aug. 23, 1993

Related U.S. Application Data

[63] Continuation of Ser. No. 613,034, Nov. 15, 1990, abandoned.

[51] Int. Cl.⁵ .......................... H04N 5/44; H04B 1/16
[52] U.S. Cl. .......................... 455/200.1; 348/729; 455/180.1; 455/207
[58] Field of Search ............... 455/160.1, 165.1, 179.1, 455/180.1, 180.2, 188.1, 188.2, 189.1, 200.1, 207, 214, 232.1, 251.1, 341; 358/191.1, 189, 198; 330/254, 278; 381/107; 348/729, 731, 738

[56] References Cited

U.S. PATENT DOCUMENTS

| | | | |
|---|---|---|---|
| 3,886,457 | 5/1975 | Petaja | 325/399 |
| 4,627,100 | 12/1986 | Takano | 455/160 |
| 4,686,707 | 8/1987 | Iwasaki | 455/200 |
| 4,881,272 | 11/1989 | Eguchi | 455/143 |
| 4,987,605 | 1/1991 | Nose | 455/161 |
| 5,144,440 | 9/1992 | Wignot et al. | 455/189.1 X |

FOREIGN PATENT DOCUMENTS

| | | |
|---|---|---|
| 362270 | 12/1931 | United Kingdom . |
| 415962 | 9/1934 | United Kingdom . |
| 531653 | 1/1941 | United Kingdom . |
| 762922 | 12/1956 | United Kingdom . |
| 1364325 | 8/1974 | United Kingdom . |
| 2239362 | 6/1991 | United Kingdom . |
| 9003696 | 4/1990 | WIPO ............. 455/200.1 |

*Primary Examiner*—Reinhard J. Eisenzopf
*Assistant Examiner*—Chi H. Pham
*Attorney, Agent, or Firm*—Joseph S. Tripoli; Peter M. Emanuel; Thomas F. Lenihan

[57] ABSTRACT

A television receiver includes a single tuner for tuning both television channels and broadcast FM stations. The tuner serves as the first conversion stage of a double conversion FM receiver, wherein the mixer of an FM radio integrated circuit serves as the second conversion stage. A single discriminator circuit is employed for tuning FM radio signals having a first deviation, such as broadcast FM radio signals, and FM radio signals having a second deviation, such as signals of the National Weather Service. Circuitry for amplifying the output signal of the discriminator circuit exhibits a first gain when amplifying FM signals having the first deviation, and exhibiting a second gain when amplifying FM signals having the second deviation.

4 Claims, 3 Drawing Sheets

AUDIO LEVEL EQUALIZATION OF BROADCAST AND NATIONAL WEATHER SERVICE FM RADIO SIGNALS

This is a continuation of application Ser. No. 07/613,034, filed Nov. 15, 1990 now abandoned.

CROSS REFERENCE TO RELATED APPLICATIONS

U.S. patent applications bearing Ser. Nos. 561,583, 561,584, 561,585, 561,586, 561,587 561,588 and 561,589, filed Aug. 6, 1990, and 571,857 filed Aug. 23, 1990 are assigned to the same assignee as the subject application, and contain related subject matter.

FIELD OF THE INVENTION

The subject application generally concerns the field of FM radio receivers for receiving both broadcast FM and National Weather Service signals, and particularly television receivers including an FM radio for receiving both broadcast FM and National Weather Service signals.

BACKGROUND OF THE INVENTION

In the United States, the broadcast FM radio band occupies a band of frequencies extending from approximately 88 MHz to approximately 108 MHz. This band of frequencies lies between the frequencies allocated for broadcast television channel 6 and television cable channel 98. In addition, the National Weather Service broadcasts FM radio signals in a band of frequencies near 162.5 Mhz. Single-tuner multiband radio receivers having the capability to receive AM, broadcast FM, and National Weather Service radio signals, and television sound signals, are known from, for example, the Windsor Radio, model number 2239, FCC ID number BGK91F2239, manufactured in Hong Kong.

Television receivers having the capability to receive broadcast FM signals are known from the prior art. The Dumont model RA-119A television receiver, manufactured by Allen B. Dumont Laboratories, Passaic, N.J., is an example of a class of television receivers having a single tuner for receiving both television signals and broadcast FM radio signals. This single-tuner class of television receivers was manufactured during the years 1949 to 1952 inclusive, and utilized a continuous tuning arrangement for tuning signals having frequencies between 44 MHz and 217 MHz. This class of television receivers employed a so-called split sound IF system, that is, a separate sound IF channel tuned to 41.25 Mhz. The sound signals for both television and FM radio were demodulated directly from signals at the television sound IF frequency of 41.25 MHz.

Modern television receivers have abandoned the split-sound IF system in favor of the intercarrier sound system, which is less complex, less costly, and more reliable. The intercarrier-sound IF system takes advantage of the fact that the picture and sound carriers are held to close tolerances at the transmitter, ensuring that they are always separated by a constant 4.5 MHz. In an intercarrier-sound IF system, the sound IF signals are amplified along with the picture IF signals in a single IF amplifier. After amplification, the sound signals are converted to a 4.5 MHz intercarrier sound IF frequency by "beating" (i.e., heterodyning) the sound IF signals at 41.25 MHz against a signal at the picture carrier frequency of 45.75 MHz. The television sound signals are then demodulated from the resulting 4.5 MHz intercarrier signal.

Modern intercarrier-sound type television receivers cannot recover and reproduce broadcast FM radio sound signals, because FM radio signals lack a signal at the picture carrier frequency required by the television receiver circuitry for use in recovering the sound signal. Therefore, as a result of adopting the intercarrier sound system, television manufacturers wanting to provide the capability of receiving broadcast FM radio signals, added a separate FM radio having its own tuner.

Copending U.S. Pat. Ser. No. 561,588, entitled STEREO FM RADIO IN A TELEVISION RECEIVER (Wignot et al.) discloses a double conversion FM radio in which the first frequency conversion stage is the television tuner. Copending U.S. patent application Ser. No. 561,586, entitled NATIONAL WEATHER RADIO RECEPTION BY SYNTHESIZING ONLY THE CENTER FREQUENCY (Wignot et al.) discloses a system in which a double conversion FM radio using a television tuner as the first conversion stage can receive both FM radio broadcast signals and signals transmitted by the National Weather Service, both of which are processed by the same circuitry, including the same discriminator circuit.

Unfortunately, using the same discriminator circuit for demodulation of both FM broadcast signals and National Weather Service signals causes a problem in that the amplitudes of the recovered signals at the output of the discriminator circuit are vastly different. Recall that the amplitude of the demodulated audio signal is a function of the deviation of the FM carrier frequency from its nominal center frequency. Specifically, the vastly differing amplitude problem occurs because the peak deviation of broadcast FM stereo radio signals is approximately 68 kHz, while the peak deviation of the National Weather Service FM radio signals is only 5 kHz. The difference in the magnitudes of these two signals is equal to 20 log (68/5)=22.67 dB. This situation would force the listener to greatly increase the volume when the receiver is tuned to a National Weather Service station, and to greatly reduce the volume when tuning back to a broadcast FM radio station.

SUMMARY OF THE INVENTION

In a receiver having a single tuner and a single discriminator circuit employed for tuning FM radio signals having a first deviation and FM radio signals having a second deviation, circuitry for amplifying the output signal of the discriminator circuit exhibits a first gain when amplifying FM signals having the first deviation, and exhibiting a second gain when amplifying FM signals having the second deviation.

DETAILED DESCRIPTION OF THE EMBODIMENT

Although the embodiment to be described is set forth in the environment of a television receiver incorporating an FM radio, the subject invention does not require television tuner circuitry, and thus is also applicable to FM radio receivers.

Figure 1:
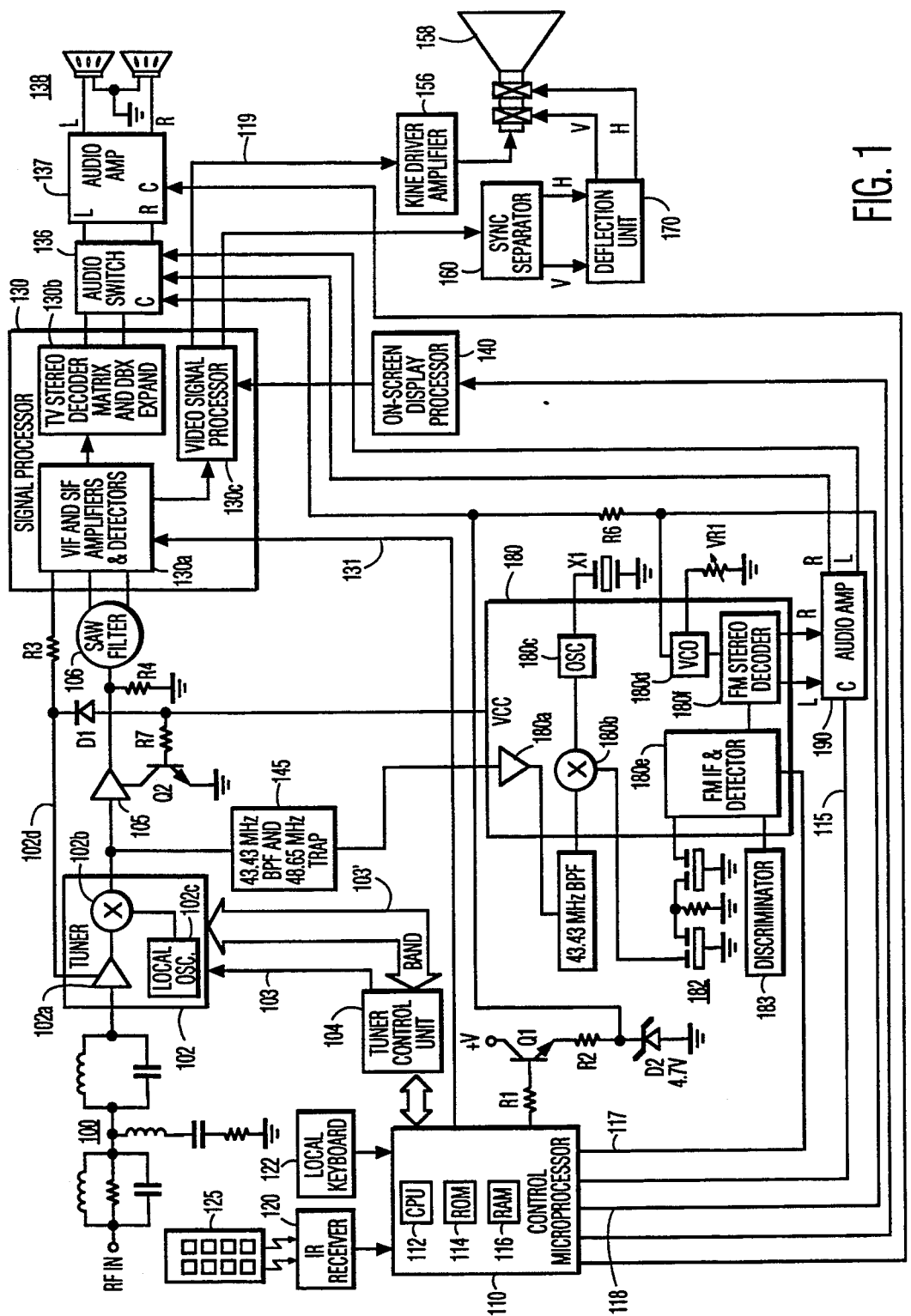
FIG. 1 shows, in block diagram form, a television receiver incorporating the subject invention.

Referring to FIG. 1, television radio frequency (RF) and broadcast FM radio frequency signals are applied an to RF input terminal of an FM trap circuit generally designated 100. RF signals appearing at the output of FM trap 100 are applied to a tuner 102. Tuner 102 includes an RF amplifier 102a for amplifying RF signals, and applying the amplified RF signals to one input of a mixer 102b. Tuner 102 also includes a local oscillator 102c for generating a local oscillator signal which when applied to a second input of mixer 102b heterodynes with the amplified RF signal and produces an output signal at the television intermediate frequency (IF frequency). Tuner 102 selects a particular RF signal under control of a tuner control unit 104. Alternatively, tuner control unit 104 may also be included within tuner 102. Tuner control unit 104 applies a tuning control signal to tuner 102 via a wire 103, and applies bandswitching signals via a control bus 103'. The tuning control signal and bandswitching signals control the frequency at which local oscillator 102c oscillates, thus determining which RF signal is converted (heterodyned) to the IF frequency. Tuner control unit 104 is controlled by a controller 110. Controller 110, which may be a microprocessor or microcomputer, includes a central processing unit (CPU) 112, a read-only memory (ROM) 114, and a random access memory 116. Controller 110 receives user-entered control signals from a local keyboard 122, and from an infrared (IR) receiver 120. IR receiver 120 receives and decodes remote control signals transmitted by a remote control unit 125.

The intermediate frequency (IF) signal produced by tuner 102 is applied to a surface acoustic wave (SAW) filter preamplifier 105 which amplifies the IF signal and applies it, via SAW filter 106 to a so-called "one-chip" signal processing unit 130. Signal processing unit 130 includes a video IF (VIF) and sound IF (SIF) signal processor unit 130a, an audio signal processor unit 130b, and video signal processor 130c. VIF/SIF signal processing unit 130a comprises a video IF (VIF) amplifying stage, an automatic gain control circuit (AGC), an automatic fine tuning circuit (AFT), a video detector, and a sound IF (SIF) amplifying stage. VIF/SIF processing unit 130a produces a baseband composite video signal (TV), and a sound carrier signal. The sound carrier signal is applied to an audio signal processor unit 130b which includes a TV stereo decoder, a matrix, and a DBX expander. Audio signal processor unit 130b produces left and right audio signals and applies them to one pair of inputs of an audio switch unit 136. The output of audio switch unit 136 is coupled to an audio amplifier unit 137. Audio amplifier unit 137 produces amplified baseband left and right audio signals and applies them to a pair of speakers 138 for sound reproduction.

The baseband video signal (TV) is coupled to video processor unit 130c and a kine driver amplifier 156, and ultimately displayed on a display screen of a display device 158. Video signals from video processor unit 130c are also applied to a sync separator unit 160 which derives vertical and horizontal synchronizing signals therefrom. The derived vertical and horizontal signals are applied to a deflection unit 170 for the production of deflection signals for application to the yoke assembly of display device 158. Under control of controller 110, an on-screen display processor 140 generates character signals, and applies them to a second input of video signal processor 130c, for display on display device 158. The circuitry described thus far, with the exception of the particular FM trap shown in FIG. 1, is known from the RCA CTC 156 color television chassis, manufactured by Thomson Consumer Electronics, Inc., Indianapolis, Ind.

The intermediate frequency (IF) signal produced by tuner 102 is also applied, via a 43.3 Mhz bandpass filter and 48.65 MHz trap arrangement 145, to a single chip FM radio integrated circuit (IC) 180. FM radio IC 180 is, for example, a CXA12338M/S AM/FM Stereo Radio Circuit manufactured by SONY Corporation. FM radio IC 180 includes an amplifier 180a, a mixer 180b, an oscillator 180c, a voltage controlled oscillator (VCO) 180d, an FM IF and detector unit 180e, and an FM stereo decoder unit 180f.

Television tuner 102 is used as the first frequency conversion stage of a double conversion tuner for the FM broadcast band, wherein the second frequency conversion stage of the double conversion tuner is provided by FM radio IC 180. That is, a particular FM radio signal is selected and converted in frequency from one of the FM radio band of frequencies, to a first intermediate frequency of 43.3 MHz. The value 43.3 MHz is important and its selection is discussed in detail in co-pending U.S. patent application Ser. No. 561,585 (Grubbs).

The signals at the first FM radio IF frequency are then heterodyned in mixer 180b with the 54.0 MHz oscillator signals produced by fixed frequency crystal-controlled oscillator 180c. It was found that it is desirable to crystal-control oscillator 180c to avoid drifts in frequency due to temperature changes which may occur in and around the area of oscillator 180c. The result of the heterodyning process is an FM radio signal at the nominal FM IF frequency of 10.7 MHz, which is then filtered in a ceramic resonator arrangement, generally designated 182. The second ceramic resonator of ceramic resonator arrangement 182 was added to improve selectivity. Signals at the output of ceramic resonator arrangement 182 are then amplified, detected, and decoded by FM signal processing units 180d, 180e, and 180f, in the normal manner. A discriminator unit 183 is employed in the FM radio detection process, and may be a ceramic filter unit tuned to 10.7 MHz, such as a model CDA 10.7MG3-Z, manufactured by Murata Erie North America, Smyrna, Ga. Discriminator unit 183 will be discussed below in greater detail with respect to FIG. 2.

A potentiometer VR1 is provided for adjustment of the VCO frequency. Decoded left and right stereo signals are applied to an audio amplifier 190. Audio amplifier 190 will be described in greater detail below. Amplified left (L) and right (R) stereo signals are applied to a second pair of input terminals of audio switch 136. When the decoded and amplified left (L) and right (R) radio stereo signals are selected by audio switch unit 136, they are applied to audio amplifier 137 for reproduction in speaker arrangement 138. The audio volume is controlled by a control signal generated by controller 110 and applied to audio amplifier 137 via a line 119. Lines 117 and 118 coupled between FM radio IC 180 and controller 110 convey signals indicative of whether a signal is tuned, and whether a signal is in stereo, respectively.

Tuner 102 is of the frequency synthesis (FS) type, which means that the frequency of the local oscillator can be changed in a series of steps of a given size under control of controller 110. In FM reception mode, controller 110 causes oscillator 102c to change its frequency in 31.5 kilohertz steps. This means that there can be a mistuning of an FM station by a maximum of 31.5 kHz/2, or 15.75 kHz error. This is acceptable because FM radio IC 180 has acceptable demodulation characteristics over a range of approximately ±110 kHz, and also because the FM broadcast frequencies are spaced 200 kHz apart.

In operation, controller 110 receives a command, via local keyboard 122, or via IR receiver 120, to enter the FM radio mode. In response, controller 110 applies a signal to the base of transistor Q1 via resistor R1. Transistor Q1 switches on and provides a source of supply voltage to a voltage regulator circuit R2, D2 which in turn provides power (VCC) to operate FM radio IC 180. This switched VCC is also applied to the control terminal of stereo switch 136 and causes the selection the FM radio audio signals in FM radio mode. Controller 110 also applies a VIDEO DISABLE control signal to VIF/SIF processing unit 130a via a control line 131. The VIDEO DISABLE control signal sets the IF automatic gain control (IF AGC) to its lowest setting to inhibit the amplification of unwanted signals during FM reception mode.

In FM mode, the television AGC signals are disconnected frown the RF amplifier because no meaningful AGC signals are being produced in the VIF circuitry. Disconnecting of the AGC signals is accomplished by applying the 4.7 volt FM radio switched VCC to AGC line 102d via a diode D1. A resistor R3 isolates the AGC circuitry from the applied VCC. The amplitude of the switched VCC after passing through diode D1 is approximately 4 volts. Applying a fixed 4 volt signal to the AGC control terminal of RF amplifier 102a causes it to operate in a lower gain mode.

Unwanted FM radio signals are prevented from reaching the input of "one-chip" television signal processor 130 by disabling SAW filter preamplifier 105. The disabling of preamplifier 105 is accomplished by applying the switched FM radio VCC, via a base resistor R7, to a transistor Q2 which in turn applies a control signal to a control input of SAW filter preamplifier 105. Disabled preamplifier 105 attenuates unwanted FM radio signals at the input of signal processing unit 130.

Figure 2:
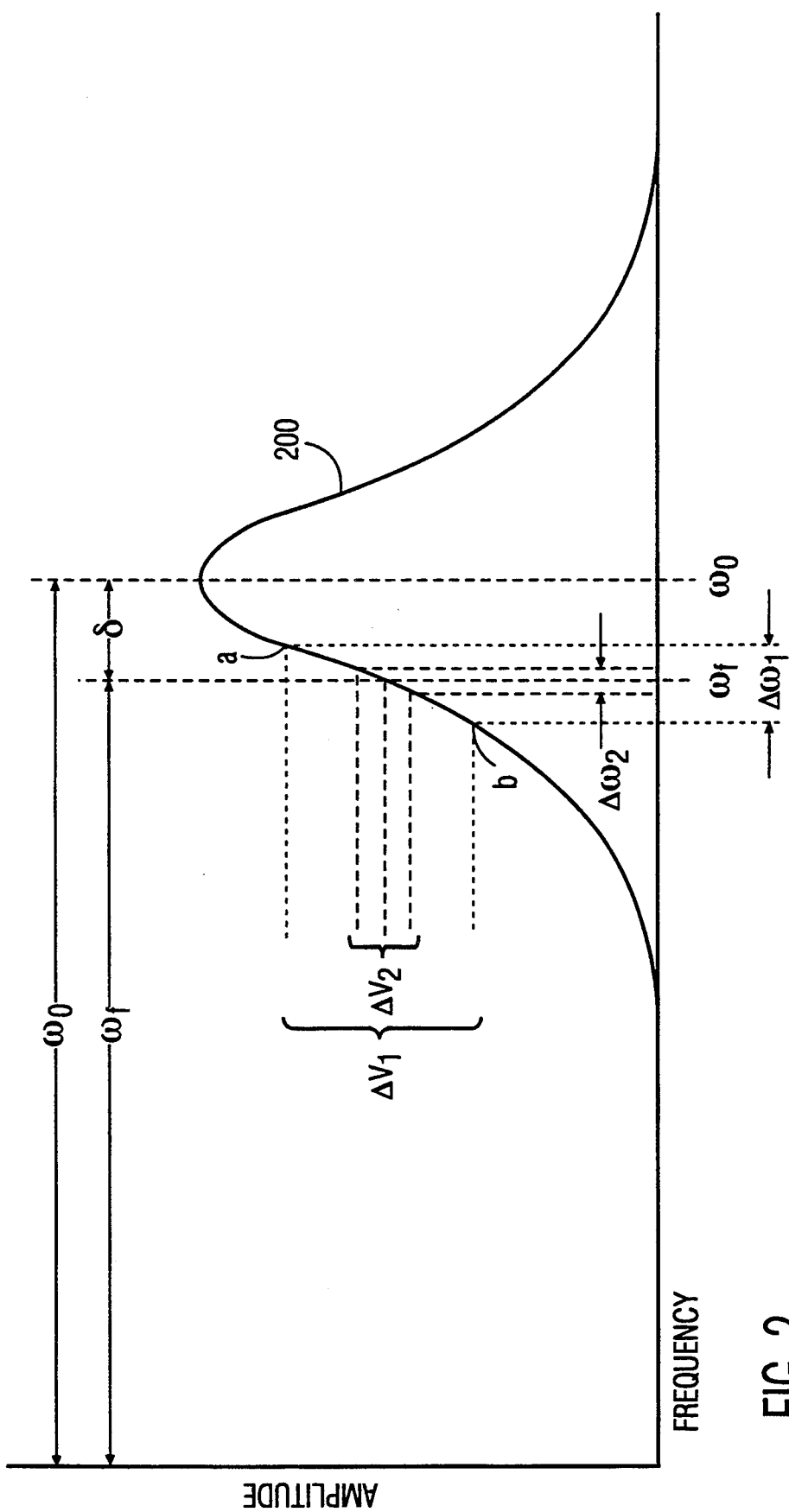
FIG. 2 shows the frequency response of a single-tuned discriminator circuit, suitable for use as the discriminator circuit of FIG. 1.

The subject invention will now be described with reference to FIGS. 2 and 3. FIG. 2 shows the frequency response 200 of a typical FM discriminator unit, such as discriminator unit 183. In FIG. 2, the symbol $\omega_0$ represents the frequency to which the discriminator is tuned. The symbol $\omega_f$ represents the nominal or center frequency of the FM carrier to be demodulated. The frequency $\omega_f$ is displaced from the tuned frequency $\omega_0$ by an amount $\delta$, such that the center frequency lies on the lower slope of frequency response 200 in the approximate center of a substantially linear region extending between points a and b. For a given frequency deviation $\Delta\omega_1$ of the FM carrier signal, a corresponding signal amplitude change $\Delta V_1$ is produced. Thus, a frequency modulated (FM) carrier signal can be demodulated by applying the carrier to a discriminator unit exhibiting the characteristics shown in FIG. 2. That is, a frequency deviation of the FM carrier towards point a will produce a larger amplitude output signal; and a frequency deviation of the FM carrier towards point b will produce a smaller amplitude output signal.

As noted above, the same discriminator unit (i.e. discriminator unit 183) is used for the demodulation both FM broadcast (i.e. wideband) signals and signals transmitted by the National Weather Service (i.e., narrowband signals). Broadcast monophonic FM radio signals have a maximum frequency deviation of ±75 kHz for full dynamic range, and broadcast stereophonic (stereo) FM signals have a maximum frequency deviation of approximately ±68 kHz for dynamic range (approximately 10% of the deviation is used by the pilot signal required for stereo demodulation). The ±68 kHz frequency deviation is represented in FIG. 2 by the symbol $\Delta\omega_1$. The frequency modulated carrier transmitted by the National Weather Service is a narrow band signal, that is, it exhibits a maximum frequency deviation of ±5 kHz for full dynamic range. The ±5 kHz frequency deviation is represented in FIG. 2 by the symbol $\Delta\omega_2$.

When signals of the National Weather Service having a frequency deviation of ±5 kHz ($\Delta\omega_2$) are applied to discriminator 183 they produce a corresponding output signal amplitude in the range shown as $\Delta V_2$. For simplicity, FIG. 2 is not drawn to scale. If it were, the great difference (approximately 22.67 dB) between A $\Delta V_1$ and $\Delta V_2$ would be even more apparent. The unfortunate result of the great difference in output amplitudes of the demodulated signals of the broadcast FM band and the National Weather Service FM band is that a listener who is tuned to a broadcast FM station would experience a great volume reduction when changing channels to a National Weather Service station. The listener would then be forced to increase the volume by adjusting the volume control in an attempt to reestablish a normal audio level. It is important to note that the output signal amplitude from the discriminator for National Weather Service signals is so low that even at maximum the volume setting the reproduced audio would be unacceptably low. After having increased the volume setting to its maximum position, if the listener then changes channels back to a broadcast FM station, the volume setting would be much too high forcing the listener to once again adjust it for a comfortable listening level. Such repeated readjustment of volume when changing between stations in different FM bands is extremely annoying to a listener.

It is herein recognized that the advantageous use of the same circuitry, from antenna terminals to speakers, for the reception and reproduction of the grossly different FM broadcast radio signals and signals of the National Weather Service created the new unequal-amplitude problem described above. In order to solve the above-described problem some means must be provided for equalizing the amplitudes of signals demodulated from carriers of the two FM bands.

Figure 3:
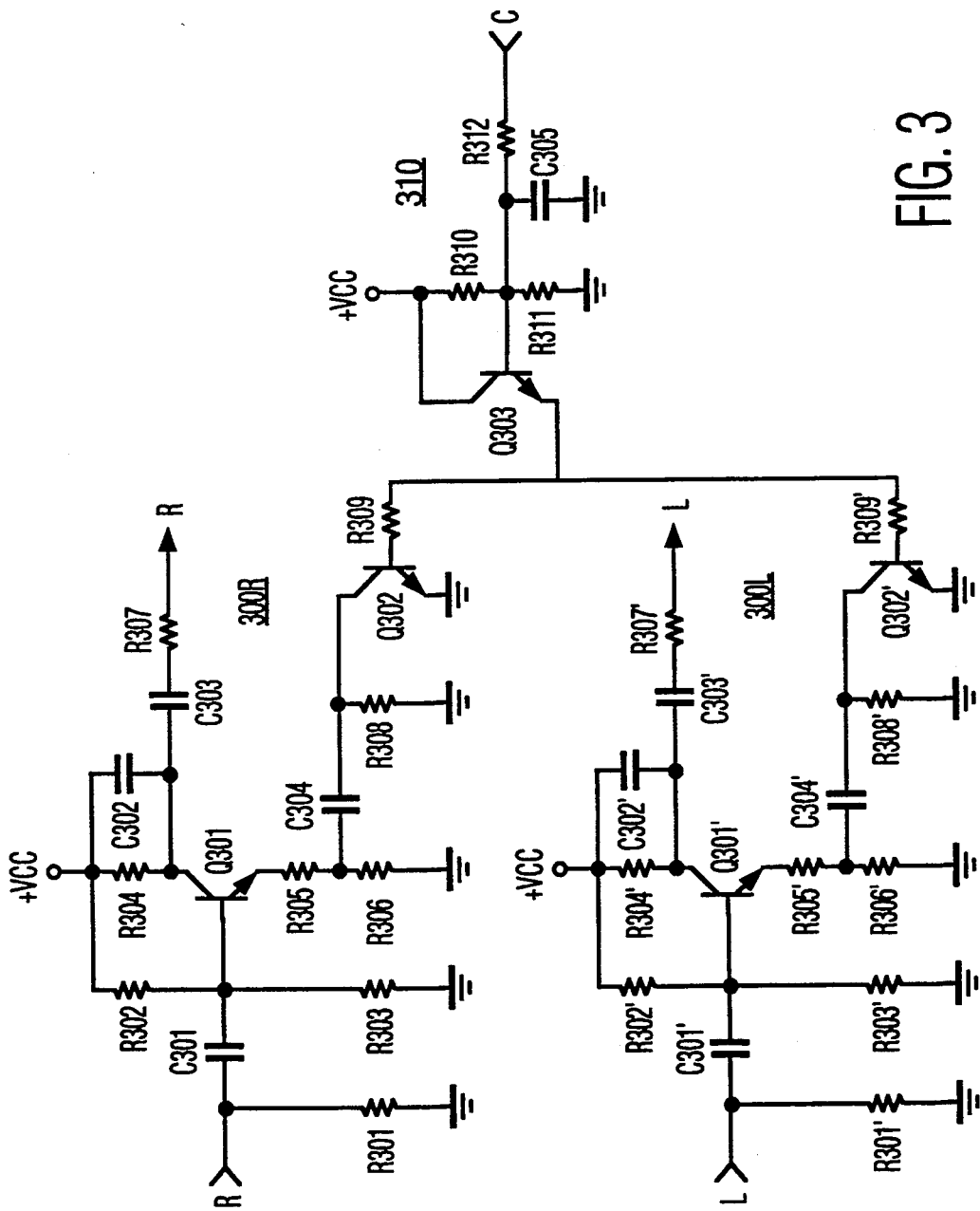
FIG. 3 shows, in schematic form, an embodiment of the invention suitable for use as an audio amplifier of FIG. 1.

FIG. 3 shows a circuit embodiment of an amplifier which is automatically switched from a first gain setting to a second gain setting to compensate for the unequal amplitude input signals. The circuit of FIG. 3 has a selectable emitter resistance to provide a gain of 1.719 in broadcast FM radio reception mode, and a gain of 23.38 in National Weather Service reception mode. Note that 20 log (23.38/1.719)=22.67 dB, the exact value need to compensate for the amplitude differences. The gain of 1.719 was chosen to compensate for the difference in amplitude between FM broadcast radio signals and amplitude of the television audio signals. Thus, the audio levels of TV, FM broadcast radio, and National Weather Service, are equalized.

FIG. 3 shows a stereo amplifier, generally designated 300, suitable for use as audio amplifier 190 of FIG. 1. Amplifier 300 comprises a right channel, generally designated 300R, having components numbered 301 to 309, an identical left channel, generally designated 300L, having components numbered 301' to 309', and a control arrangement generally designated 310. The left channel 300L will not be described in detail because it is identical to the right channel 300R in structure and operation. Right channel signals are applied to terminal R, developed across a resistor R301, and AC coupled via a capacitor C301. Resistors R302 and R303 develop base bias for an amplifying transistor Q301. Collector resistor R304 develops the output signal from the amplifier. Emitter resistors R305, and R306, and AC coupled emitter resistor R308, in combination with collector resistor R304, resistor R307 and a load impedance (not shown) set the gain of the amplifier. A capacitor C302 bypasses collector resistor R304 for high frequencies. The amplified right channel signal is AC coupled to the output via a coupling capacitor C303.

The gain of the amplifier is switched from a low gain state to a high gain state by providing an AC short circuit around emitter resistor R306 under control of a gain-switching control signal applied to control terminal C of control arrangement 310. Referring once again to FIG. 1, the gain-switching control signal is generated by controller 110, and applied to audio amplifier 190 via a wire 115, in response to whether or not a National Weather Service station is being tuned.

Returning now to FIG. 3, a resistor R312 limits the current into the base electrode of control transistor Q303, and a capacitor C305 provides high frequency filtering of the gain-switching control signal. Resistors R310 and R311 develop base bias for control transistor Q303. A high level signal applied to control terminal C will turn on transistors Q303 and Q302, thereby changing the ratio of emitter to collector impedances, which changes the gain of the amplifier. Specifically, resistor R308 is AC coupled in parallel with emitter resistor R306 via a coupling capacitor C304. In high gain mode, the impedances of both resistor R306 and resistor R308 are essentially removed from the circuit and replaced by the low impedance of saturated transistor Q302. It is important to note that because resistor R308 keeps the negative plate of capacitor C304 at ground potential, transistor Q302 only conducts AC transitions, thus eliminating annoying pops in the reproduced audio which would otherwise be caused by the switching of DC currents.

The following values have been found to give satisfactory performance.

| R301/R301' | 7.5 kilohms | C301/C301' | 3.3 microfarads |
|---|---|---|---|
| R302/R302' | 68 kilohms | C302/C301' | .015 microfarads |
| R303/R303' | 27 kilohms | C303/C303' | 1.5 microfarads |
| R304/R304' | 5.1 kilohms | C304/C304' | 100 microfarads |
| R305/R305' | 120 ohms | C305/C305' | 1000 picofarads |
| R306/R306' | 2.7 kilohms | | |
| R307/R307' | 1 kilohm | | |
| R308/R308' | 3 kilohms | | |
| R309/R309' | 3 kilohms | | |
| R310 | 100 kilohms | | |
| R311 | 62 kilohms | | |
| R312 | 1 kilohm | | |

It is herein specifically recognized that the subject invention is also useful in videocassette recorders (VCRs). The term television receiver, as used herein, includes television receivers having a video display device (commonly known as television sets) and television receivers without a display device, such as VCRs.

What is claimed is:

1. An FM radio receiver, comprising:

tuner means for receiving wideband FM radio RF signals in a first band of frequencies, and narrowband FM radio signals in a second band of frequencies, said tuner means selecting a particular FM radio RF signal from a plurality of FM radio RF signals in response to a first control signal, converting the frequency of said selected signal to an intermediate frequency and developing said selected intermediate frequency signal at an output;

intermediate frequency (IF) amplifier means for amplifying said selected intermediate frequency signal;

control means for generating said first control signal for causing said tuner means to select said particular FM radio RF signal;

means for demodulating audio signals from said FM radio RF signals at said intermediate frequency; and audio amplifier means for receiving said demodulated audio signals from said means for demodulating, and amplifying said demodulated audio signals, said audio amplifier means being controlled to amplify signals in one of a low gain mode and a high gain mode of operation in response to a second control signal, said audio amplifier means producing audio signals exhibiting substantially the same dynamic range in both of said low gain and high gain modes of operation;

said control means generating said second control signal for causing said audio amplifier means to switch from said low gain mode of operation to said high gain mode of operation when said tuner means is controlled to tune one of said narrowband FM radio RF signals in said second band of frequencies;

said audio amplifier means including an emitter circuit and said audio amplifier means being changed from said low gain mode to said high gain mode by lowering the impedance to AC signals in said emitter circuit of said audio amplifier means.

2. The FM radio receiver of claim 1 wherein said means for demodulating includes a single discriminator circuit, and said single discriminator circuit is used for demodulating both said wideband signals and said narrowband signals.

3. An FM radio receiver, comprising:

tuner means for receiving FM radio RF signals having respective carrier signals exhibiting a first frequency deviation and being grouped in a first band of frequencies, and FM radio RF signals having respective carrier signals exhibiting a second frequency deviation and being grouped in a second band of frequencies, said tuner means selecting a particular FM radio RF signal from a plurality of FM radio RF signals in response to a first control signal, converting the frequency of said selected FM RF signal to an intermediate frequency and developing said selected intermediate frequency signal at an output;

intermediate frequency (IF) amplifier means for amplifying said selected intermediate frequency signal;

control means for generating said first control signal for causing said tuner means to select said particular FM radio RF signal;

means for demodulating audio signals from said signals at said intermediate frequency, said means for demodulating signals including a common discriminator circuit for demodulating signals of both said first and second frequency deviations; and audio amplifier means for receiving said demodulated audio signals from said means for demodulating, and amplifying said demodulated audio signals, said audio amplifier means being controlled to amplify signals in one of a low gain mode and a high gain mode of operation in response to a second control signal, said audio amplifier means producing audio signals exhibiting substantially the same dynamic range in both of said low gain and high gain-modes of operation;

said control means generating said second control signal for causing said audio amplifier means to switch from said low gain mode of operation to said high gain mode of operation when said tuner means is controlled to tune one of said FM radio RF signals exhibiting said second frequency deviation;

said audio amplifier means including an emitter circuit and said audio amplifier means being changed from said low gain mode to said high gain mode by lowering the impedance to AC signals in said emitter circuit of said audio amplifier means.

4. A television receiver, comprising:

tuner means for operating in a first mode for receiving television RF signals, said tuner means selecting a particular television RF signal from a plurality of television RF signals in response to a first control signal, converting the frequency of said selected signal to a television intermediate frequency and developing said television intermediate frequency signal at an output;

television intermediate frequency (IF) amplifier means for receiving and amplifying said television intermediate frequency signal;

control means for generating said first control signal for causing said tuner means to select said particular RF signal;

said tuner means also operating in a second mode, in response to a second control signal, as a first frequency conversion stage for a double conversion FM radio signal receiver, for receiving FM signals exhibiting a first maximum frequency deviation and FM signals exhibiting a second maximum frequency deviation, and for converting said FM signals to a first radio intermediate frequency;

a second frequency conversion stage of said double conversion FM radio signal receiver, said second frequency conversion stage receiving said signals at said first radio intermediate frequency and converting said signals to a second radio intermediate frequency; and means for demodulating audio signals from said signals at said second radio intermediate frequency, said means for demodulating signals including a common discriminator circuit for demodulating signals of both said first and second maximum frequency deviations; and audio amplifier means for receiving said demodulated audio signals from said means for demodulating, and amplifying said demodulated audio signals, said audio amplifier means being controlled to amplify signals in one of a low gain mode and a high gain mode of operation in response to a third control signal, said audio amplifier means producing audio signals exhibiting substantially the same dynamic range in both of said low gain and high gain modes of operation;

said control means generating said second control signal for causing said tuner to switch from said first mode of operation to said second mode of operation, and generating said third control signal for causing said audio amplifier means to switch from said low gain mode of operation to said high gain mode of operation when said tuner means is controlled to tune one of said FM radio RF signals exhibiting said second maximum frequency deviation;

said audio amplifier means including an emitter circuit and said audio amplifier means being changed from said low gain mode to said high gain mode by lowering the impedance to AC signals in said emitter circuit of said audio amplifier means.

* * * * *

UNITED STATES PATENT AND TRADEMARK OFFICE
CERTIFICATE OF CORRECTION

PATENT NO. : 5,361,406

DATED : November 1, 1994

INVENTOR(S) : Leroy S. Wignot, et al.

It is certified that error appears in the above-identified patent and that said Letters Patent is hereby corrected as shown below:

On the Title page, under [56] References Cited, under U.S. PATENT DOCUMENTS, insert the following:

-- 4,027,242   5/77   Yamanaka             .......... 325/17
   4,935,924   6/90   Baxter               .......... 370/73
   4,881,272   11/89  Eguchi               .......... 455/143
   4,726,072   2/88   Yamashita et al.     .......... 455/189
   4,709,407   11/87  Baba                 .......... 455/226
   4,581,643   4/86   Carlson              .......... 358/191.1
   4,553,264   11/85  Hasegawa et al.      .......... 455/189
   4,499,602   2/85   Hermeling, Jr., et al. ........ 455/180
   4,272,788   6/81   Ogita                .......... 358/189
   4,162,451   7/79   Ash                  .......... 325/451
   4,903,129   2/90   Bell et al.          .......... 358/181
   4,849,721   7/89   Matsuura             .......... 333/174
   4,574,308   3/86   Gibson et al.        .......... 358/188
   4,286,288   8/81   Waldo                .......... 358/114
   4,575,761   3/86   Carlson et al.       .......... 358/191.1
   4,352,111   9/82   Carlson et al.       .......... 343/860
   4,088,959   5/78   Sumi                 .......... 325/459
   4,361,906   11/82  Sakamoto             .......... 455/140 --

UNITED STATES PATENT AND TRADEMARK OFFICE
CERTIFICATE OF CORRECTION

PATENT NO. : 5,361,406

DATED : November 1, 1994

INVENTOR(S) : Leroy S. Wignot, et al.

It is certified that error appears in the above-identified patent and that said Letters Patent is hereby corrected as shown below:

Title page, col. 2, line 7,
Under OTHER PUBLICATIONS, insert the following:

-- CTC156/157 RCA/GE Color Television Service Data.

CTC156/157-S1 RCA/GE Color Television Supplemental Service Data.

DUMONT MODEL RA-119A.

"Auf der Suche nach den Rundfunkgeraten von morgen", pgs. W216-W226, Funk-Technik, Vol. 35, No. 6/1980". --

Signed and Sealed this

Third Day of January, 1995

Attest:

BRUCE LEHMAN

Attesting Officer

Commissioner of Patents and Trademarks